US012216146B1

(12) United States Patent
Downey et al.

(10) Patent No.: US 12,216,146 B1
(45) Date of Patent: Feb. 4, 2025

(54) PORTABLE ANTENNA MEASUREMENT

(71) Applicant: United States of America as represented by the Administrator of NASA, Washington, DC (US)

(72) Inventors: James M. Downey, Cleveland, OH (US); Marie T. Piasecki, Cleveland, OH (US); Bryan L. Schoenholz, Cleveland, OH (US)

( * ) Notice: Subject to any disclaimer, the term of this patent is extended or adjusted under 35 U.S.C. 154(b) by 398 days.

(21) Appl. No.: 17/486,017

(22) Filed: Sep. 27, 2021

Related U.S. Application Data

(60) Provisional application No. 63/083,340, filed on Sep. 25, 2020.

(51) Int. Cl.
*G01R 29/08* (2006.01)
*G01R 29/10* (2006.01)
*H01Q 1/28* (2006.01)

(52) U.S. Cl.
CPC ......... *G01R 29/0878* (2013.01); *G01R 29/10* (2013.01); *H01Q 1/28* (2013.01)

(58) Field of Classification Search
CPC .... G01R 27/04; G01R 29/105; H01Q 21/064; H01Q 3/247; H01Q 3/267; H01Q 3/2676
USPC ..................................................... 455/115.1
See application file for complete search history.

(56) References Cited

U.S. PATENT DOCUMENTS

| | | | | |
|---|---|---|---|---|
| 10,085,162 | B2 * | 9/2018 | Foegelle | G01R 29/105 |
| 10,488,512 | B1 * | 11/2019 | Pounds | G05D 1/0676 |
| 11,804,914 | B1 * | 10/2023 | Yousefi | H01Q 3/267 |
| 2011/0102277 | A1 * | 5/2011 | Eibert | G01R 29/10 |
| | | | | 343/703 |
| 2012/0268153 | A1 * | 10/2012 | Nickel | G01R 31/3025 |
| | | | | 324/754.31 |
| 2015/0116164 | A1 * | 4/2015 | Mannion | G01R 31/001 |
| | | | | 343/703 |
| 2017/0223559 | A1 * | 8/2017 | Kong | H04B 7/0413 |
| 2019/0287063 | A1 * | 9/2019 | Skaaksrud | B25J 9/1679 |
| 2020/0028598 | A1 * | 1/2020 | Jing | G01R 29/10 |
| 2020/0180754 | A1 * | 6/2020 | Schonfelder | G01G 19/07 |
| 2021/0171214 | A1 * | 6/2021 | Schonfelder | B64U 10/14 |
| 2022/0260623 | A1 * | 8/2022 | Fisher | G01R 1/0408 |
| 2022/0365174 | A1 * | 11/2022 | Mihlin | H01Q 1/1257 |

* cited by examiner

*Primary Examiner* — Tan H Trinh
(74) *Attorney, Agent, or Firm* — Robert H. Earp, III; Mark Wolfgang; Trent J. Roche

(57) ABSTRACT

A portable antenna measurement system is disclosed. The antenna measurement system can include a robotic arm with an antenna probe on one end, a laser tracker, a vector network analyzer, and a computing device. The computing device can receive input from the laser tracker identifying the position of an antenna and other objects in the environment and generate a scan surface around an antenna under test. The computing device can instruct the robotic arm to move the antenna probe into positions in the scan surface to acquire radiation measurements. If portions of the scan surface are unreachable by the robotic arm, the robotic arm can be repositioned, and measurements can be resumed. The network vector analyzer can acquire and save measurements. An antenna pattern can then be generated based on point measurements and output for display.

11 Claims, 10 Drawing Sheets

PORTABLE ANTENNA MEASUREMENT

CROSS-REFERENCE TO RELATED APPLICATION

This application claims the benefit of U.S. Provisional Application No. 63/083,340, filed Sep. 25, 2020, and entitled "TRANSPORTABLE ROBOTIC ANTENNA MEASUREMENT SYSTEM FOR IN SITU ANTENNA METROLOGY," the entirety of which is incorporated herein by reference.

ORIGIN OF THE INVENTION

The invention described herein was made by employees of the United States Government and may be manufactured and used by or for the United States Government for Government purposes without the payment of any royalties thereon or therefor.

BACKGROUND

Antenna testing is performed to ensure performance meets expectations. The testing can involve measuring a variety of different antenna characteristics. For example, radiation patterns, efficiency, and gain can all be measured for an antenna. Antenna testing can be performed in an anechoic chamber, which is typically a dedicated room at a facility. The space includes material resembling acoustic panels that covers the walls and doors to absorb electromagnetic energy. High precision positioners bolted into the ground can move a probe to specific locations to measure the radiated field from the antenna under test.

Antennas can be mounted on aircraft, automobiles, or other large objects. Testing can also be desired to evaluate the impact of the plane and protective covers on the antenna. In this situation, the aircraft, or the like, needs to be transported to a large, dedicated facility that resembles an aircraft-hangar-sized anechoic chamber.

SUMMARY

The following presents a simplified summary to provide a basic understanding of some aspects of the disclosed subject matter. This summary is not an extensive overview. It is not intended to identify key/critical elements or to delineate the scope of the claimed subject matter. Its sole purpose is to present some concepts in a simplified form as a prelude to the more detailed description presented later.

Briefly described, the subject disclosure pertains to portable antenna measurement that allows measurement of an installed antenna to occur in situ, such as in an airplane hangar where a plane resides. Equipment can be packed on a set of pallets and shipped to a location. The equipment can comprise a collaborative robotic arm fitted with an antenna probe on a lift attached to a mobile base, a laser tracker, and a rack assembly comprising computing hardware. Once deployed, the system can be configured to scan over arbitrary geometric shapes, accommodate different scan sizes, and be used for near-field and far-field data collection. Further, the system can accurately test configurations where an installed antenna is not visible or covered by a radome or the like.

According to one aspect, a portable antenna measurement system is provided. The system includes a mobile base, a lift portion attached perpendicular to the mobile base and extending vertically, a collaborative robotic arm connected at a first end to the lift portion, and an antenna probe affixed to a second end of the collaborative robotic arm. The antenna probe can be configured to measure antenna performance at particular locations reachable by the robotic arm. The lift portion height is adjustable vertically to increase reach of the robotic arm and the antenna probe. Further, the position of the antenna probe is adjustable with six degrees of freedom, and the antenna probe can measure spherical, cylindrical, planar, and parametric scan surfaces. The laser tracker or similar optical system can generate a set of coordinates associated with an environment surrounding an antenna, in which the set of coordinates corresponds to a virtual representation of the environment. The antenna's environment can comprise an aircraft to which the antenna is mounted as well as the mobile base, lift portion, collaborative robotic arm, and antenna probe. In one instance, the laser tracker can also be mounted on a mobile base. The system can further comprise a vector network analyzer, communicatively coupled to the antenna probe that includes a source to generate a signal and a receiver to receive a signal from an antenna. Furthermore, the system can include a computing device comprising a processor coupled to a memory that includes instructions that, when executed by the processor, cause the processor to construct a path of points from which to collect measurements with the antenna probe and generate an antenna pattern from point measurements.

According to another aspect, a method is provided comprising creating a virtual environment from laser tracker data in which the virtual environment includes a collaborative robotic arm and attached antenna probe, determining a set of points to measure antenna performance for a specified scan surface, determining a path plan defining an order in which the points will be measured, identifying a next point in the path plan, and sending a command to the collaborative robotic arm and attached antenna probe to move to and perform a measurement at the next point. The method further comprises determining whether the next point is reachable before sending the command, initiating repositioning of the collaborative robotic arm horizontally or vertically when the next point is unreachable, and sending the command when the repositioning is complete. In one instance, measurements can be recorded separately for particular positions. Accordingly, the method can further comprise combining measurements recorded before repositioning with measurements recorded after repositioning. The method can also include predicting, before sending the command, that a collision will occur if the command is sent and executed and halting the process in response to a predicted collision. Furthermore, the method comprises generating an antenna pattern based on measurements at the points and conveying the antenna pattern for display on a display device.

In accordance with another aspect, a method is disclosed that comprises executing, on a processor, instructions that cause the processor to perform operations. The operations can include creating a virtual scan region around an antenna under test and structure based on position information regarding objects in a space, issuing a command to a collaborative robotic arm with an antenna probe on one end to acquire radiation measurements at positions in the virtual scan region, generating an antenna pattern based on position measurements, and conveying, for display on a display device, the antenna pattern. The operations can further comprise initiating repositioning of the robotic arm when a portion of the virtual scan surface is unmeasured and unreachable by the robotic arm and issuing another command to the collaborative robotic arm with the antenna probe to acquire radiation measurements at the positions in the virtual scan region. Further, the operations can comprise time gating to remove unwanted reflections from the radiation measurements.

To the accomplishment of the foregoing and related ends, certain illustrative aspects of the claimed subject matter are described herein in connection with the following description and the annexed drawings. These aspects indicate various ways in which the subject matter may be practiced, all of which are intended to be within the scope of the disclosed subject matter. Other advantages and novel features may become apparent from the following detailed description when considered in conjunction with the drawings.

DETAILED DESCRIPTION

It is desirable to test new antennas to ensure the antennas perform as expected. An antenna can be tested in an anechoic chamber with fixed high precision positioners that can move to specific locations with respect to an antenna under test. Aerospace antennas, or the like, can be designed to be mounted to an aircraft or other large object. When installed on a structure, antenna performance can significantly change as radiation interacts with the structure. Conventionally, a vehicle such as an aircraft needs to be transported to a large, specialized testing facility. However, these rare facilities are costly and require significant lead time to schedule testing. Further, there are significant logistical challenges in transporting a large vehicle to a facility. Once there, it is difficult to properly align large objects, such as a plane, with fixed measurement systems resulting in a loss of precision. These and other factors prohibit the use of such facilities, especially for early research and development work.

Details disclosed herein generally pertain to portable antenna measurement. A portable antenna measurement system allows measurement of an installed antenna to occur in situ, such as in an aircraft hangar. Equipment can be packed on a set of pallets and shipped to substantially any facility regardless of size, shape, or objects within them. Once deployed, the system can be configured to scan over arbitrary surface geometries (e.g., spherical, cylindrical, planer, or parametric), accommodate different scan sizes, and be used for near-field and far-field data collection. Further, the system can accurately test configurations where an installed antenna is not visible or covered by a radome or the like. The system is portable and flexible while maintaining accuracy to make precise measurements.

Various aspects of the subject disclosure are now described in more detail with reference to the annexed drawings, wherein like numerals generally refer to like or corresponding elements throughout. It should be understood, however, that the drawings and detailed description relating thereto are not intended to limit the claimed subject matter to the particular form disclosed. Instead, the intention is to cover all modifications, equivalents, and alternatives falling within the spirit and scope of the claimed subject matter.

Figure 1:
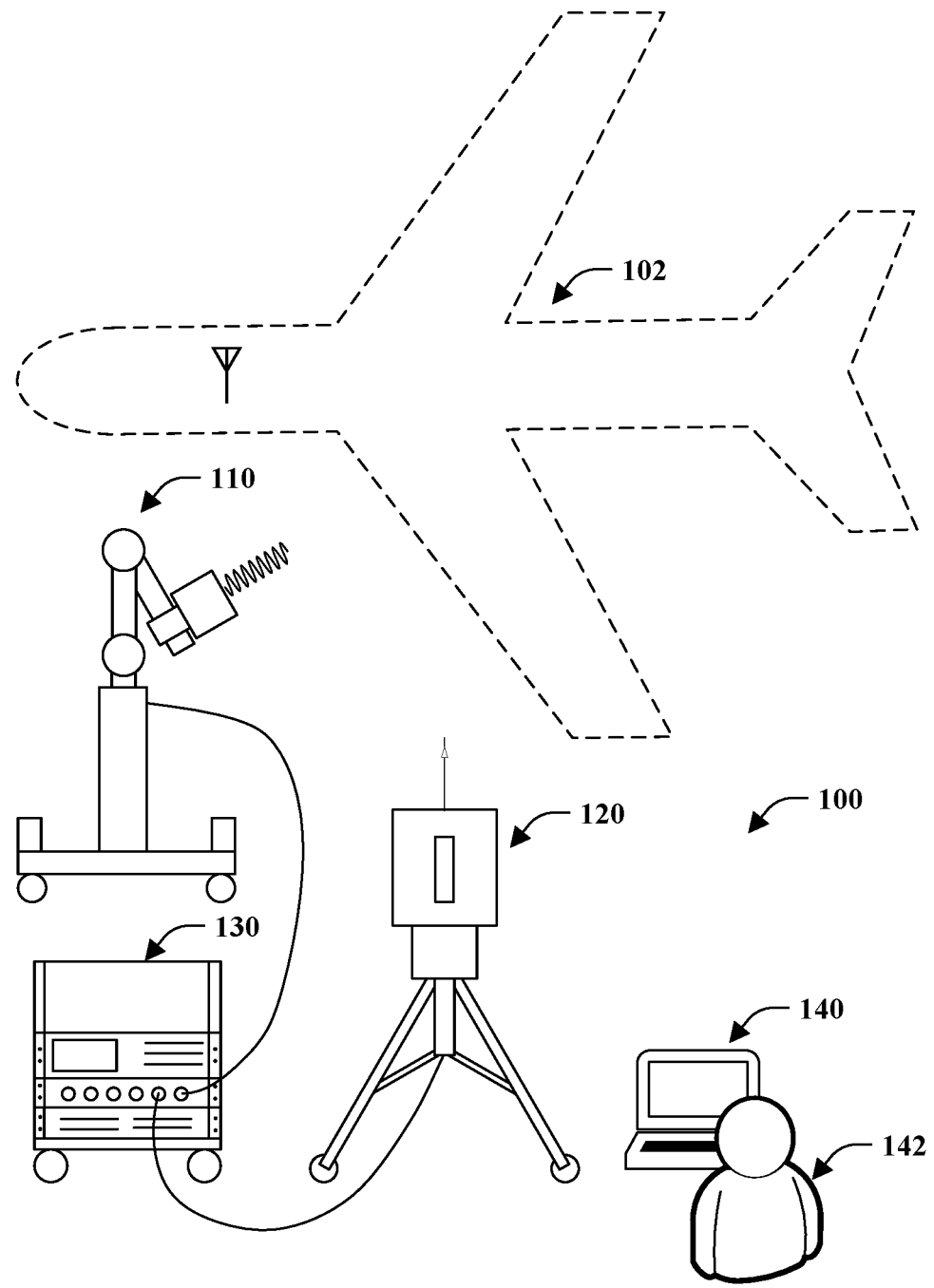
FIG. 1 illustrates an overview of an example implementation of a portable robotic antenna system.

Referring initially to FIG. 1, a high-level overview of an example implementation is depicted. As shown, the implementation includes a portable antenna measurement system 100 that operates in situ with an aircraft 102 with an installed antenna. The system 100 includes probe assembly 110, laser tracker assembly 120, rack assembly 130, and computing device 140. The components of the antenna measurement system 100 and the aircraft 102 are not shown to scale.

The probe assembly 110 comprises an antenna probe to measure radiation. The antenna probe is mounted on one end of a robotic arm. The other end of the robotic arm can be attached to a lift and mobile base. In this manner, the probe is highly flexible in terms of an ability to be positioned to a particular point, including location and orientation. In other words, the probe assembly 110 can operate with six degrees of freedom in three-dimensional space. The probe can move horizontally, left and right and forward and backward, with the base and robotic arm, vertically, up and down, with the lift kit and robotic arm, and rotationally, pitch, yaw, and roll, with the robotic arm. The base of the probe assembley can provide some rotation as well. For portability and safety, the robotic arm can be a lightweight collaborative robotic arm. Further, the probe assembly 110 can be disassembled for easy transport.

The laser tracker assembly 120 provides a workspace representation, including locations of an antenna under test, test subject, here aircraft 102, and the probe assembly 110. The laser tracker assembly 120 provides fast, low-latency performance conducive to control of the probe assembly 110. Further, the laser tracker assembly 120 can track objects such as the probe assembly 110 or portions thereof with six degrees of freedom, enabling precise positioning and orientation of the probe assembly 110 to a target. The laser tracker assembly 120 can also be mobile in that it can be relocated from one location to another by picking it up and moving it or by potentially rolling it on wheels. Further, the laser tracker assembly 120 can also be disassembled by removing the tripod stand for added portability.

The rack assembly 130 is a mobile box of rack hardware that is communicatively coupled to at least the probe assembly 110 and the laser tracker assembly 120. The rack assembly 130 includes a rack computing device to control the measurement process, including determining a scan pattern, control movements of the probe assembly 110, collision avoidance, initiating repositioning of the probe assembly 110 and laser tracker assembly 120, and producing an antenna pattern to describe performance characteristics. The rack assembly 130 can also include a programable network analyzer such as a vector network analyzer to at least receive and record point radiation measurements for further processing. An uninterruptible power supply (UPS) can also be provided in the rack assembly 130 to provide clean and continuous power regardless of the power supplied by the host facility, further supporting portability. In one instance, the UPS can be integrated with the vector network analyzer.

The computing device 140 can be configured with functionality that provides a high-level interface for controlling aspects of the measurement process. A user, such as a system operator 142, can employ the interface to initiate and configure measurement, monitor progress, address errors, and receive an output antenna pattern. Further, the computing device 140 can initiate manual movement of the probe assembly 110 horizontally or vertically by the system operator 142 in accordance with one embodiment. Similarly, the operator 142 could be prompted to reposition the laser tracker assembly 120 manually. In another embodiment, the probe assembly 110, the laser tracker assembly 120, or both can be self-driving such that manual movement is unnecessary. In one instance, the operator 142 could drive the equipment to particular locations by way of the computing device 140 or supervise movement.

Figure 2:
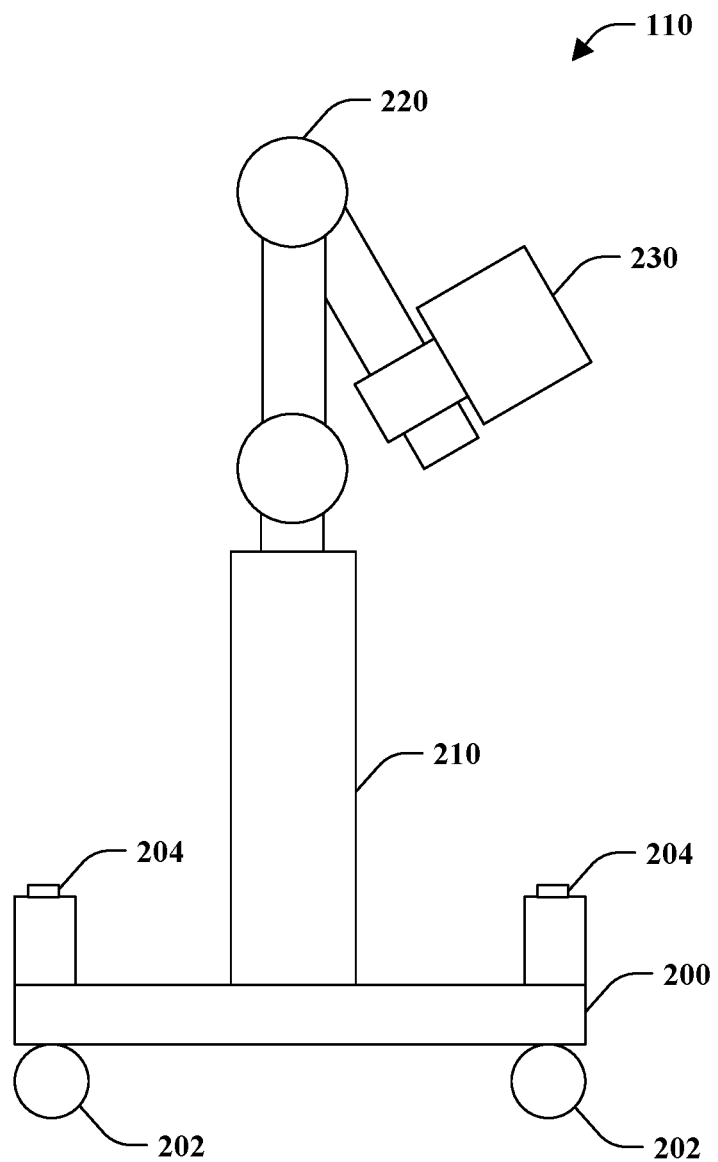
FIG. 2 is a diagram of an probe assembly.

FIG. 2 is a diagram of a sample probe assembly 110 in accordance with one embodiment. The probe assembly 110 includes a mobile base 200. The mobile base 200 can be comprised of rectangular elements in one embodiment. The first two rectangular elements can be parallel to each other. The following two rectangular elements can be parallel to each other and removably affixed on top of the first two rectangular elements such that the first two elements and the second two elements are perpendicular. There can also be a cross beam connected between the first two rectangular elements around the midpoint. The rectangular elements can be made of a solid and weighty material, such as steel, sufficient to support the weight of other assembly portions and prevent tipping when extended. The first two rectangular elements can also include rotatably affixed wheels to enable the assembly to be moved around manually. To further aid mobility, one or more handles can be attached to the other two rectangular elements to facilitate pushing and pulling.

The probe assembly 110 can also include a member 210 extending vertically with respect to the mobile base 200. The member 210 can be connected to the cross beam of the mobile base 200. The member 210 is extendable manually or automatically from a default size. Accordingly, the member 210 corresponds to a vertical positioner, vertical motion stage, or the like.

The probe assembly 110 also comprises a robotic arm 220. The robotic arm is affixed at one end to the member 210. At or around the other end of the robotic arm, an antenna probe 230 can be attached to measure performance characteristics of an antenna (e.g., radiation pattern, gain, . . . ), such as a microwave antenna. The robotic arm 220 can employ two or more joints that allow a full range of motion with respect to position and orientation of the antenna probe 230. The length of the robotic arm can limit vertical and horizontal reach. However, the member 210 can be employed to extend the robotic arm 220 vertically, and the mobile base 200 can be used to extend horizontal reach by way of repositioning.

Further, the robotic arm 220 can be a collaborative robotic arm 220, which is designed to be safe for use around human beings and eliminates a need for a protective cage or the like. The collaborative robotic arm 220 can include force sensors. If the robotic arm 220 bumps into something, the arm will stop moving. By contrast, industrial robots will keep moving until the arm breaks or the obstacle breaks. In addition to human safety, the collaborative robotic arm aids in protecting objects like expensive aircraft.

Figure 3:
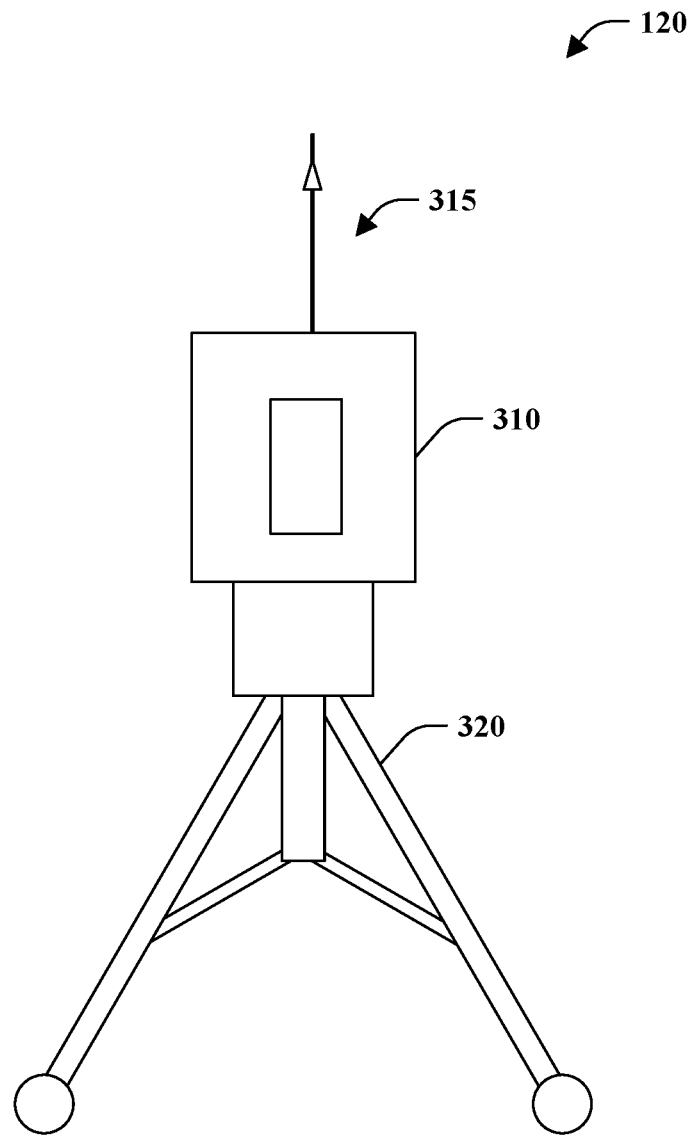
FIG. 3 is a diagram of a laser tracker assembly.

Turning to FIG. 3, an example laser tracker assembly 120 is depicted. The laser tracker assembly 120 includes a laser tracker head 310 attached to a stand 320. The laser tracker head 310 can measure three-dimensional coordinates by tracking a laser beam 315 to a reflective target in contact with an object of interest. For example, one or more reflective targets can be attached to an antenna probe to precisely determine position and orientation. Generally, the laser tracker head 310 can capture a virtual representation of an environment, including the location of the probe assembly 110 as well as a vehicle such as an aircraft on which an antenna is mounted, among other things. A lightweight, portable laser tracker head can be employed to measure with six degrees of freedom in accordance with one embodiment. In one instance, the stand 320 can be a tripod, as shown. The stand 320 can be detached from the laser tracker head 310 to improve portability further. Additionally, the stand 320 can include wheels to aid ease of movement in a measurement environment. However, the stand 320 and laser tracker head 310 can be very lightweight such that the combination can be manually picked up and moved.

Figure 4:
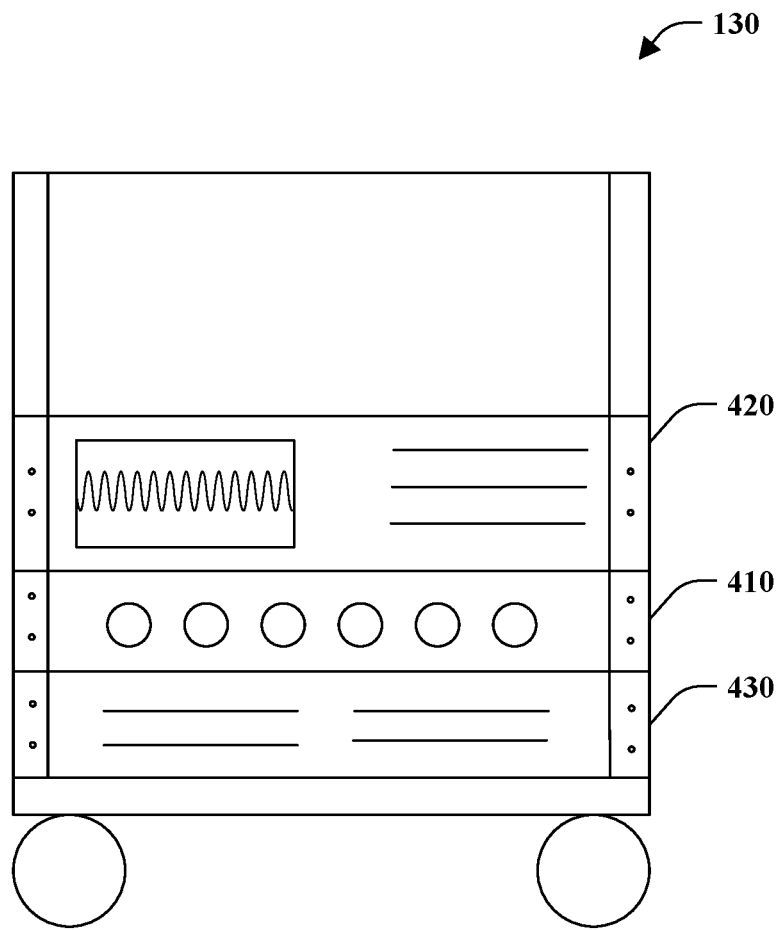
FIG. 4 is a diagram of a rack assembly.

FIG. 4 illustrates the rack assembly 130. The rack assembly 130 is a container of rack hardware employed by the measurement system. The hardware can be secured inside the rack assembly for safe transportation, and the rack assembly 130 can be on wheels to facilitate movement. The rack assembly 130 can include some plugs 410 to enable wired communication with at least the probe assembly 110 and the laser tracker assembly 120. Of course, the rack assembly 130 could also support wireless communication in another embodiment. The rack assembly 130 also includes vector network analyzer 420. The vector network analyzer 420 comprises a source to generate a signal and a receiver to receive a response to the signal from an antenna. The vector network analyzer 420 can also include other functionality such as programmable time gating to remove emissions received after a predetermined time to reduce noise from reflective surfaces in the environment. The vector network analyzer 420 can also include or employ a separate uninterrupted power supply (UPS) to provide continuous clean power regardless of the power available from a host facility.

The rack assembly also includes a rack computing device 430 that comprises at least one processor and a memory that includes instructions that, when executed by the processor, cause the processor to implement a measurement control system. The measurement control system can configure the initial setup of measurement, monitor measuring as it occurs, address any errors, and analyze and process results. Further, the measurement control system can provide a local or network-accessible interface for an operator to employ. In one instance, the rack computer can generate an antenna pattern as output from point measurements captured by the vector network analyzer 420.

Figure 5:
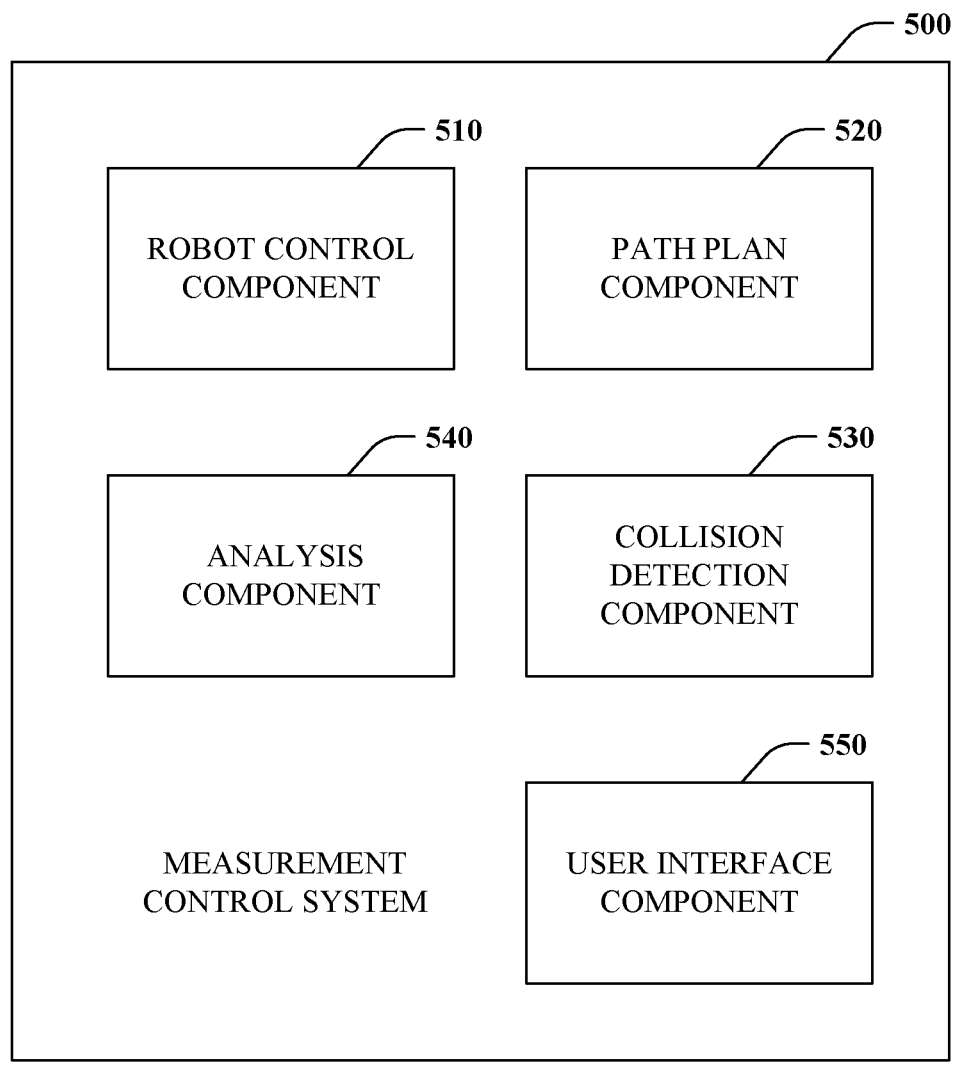
FIG. 5 is a block diagram of a measurement control system.

Turning attention to FIG. 5, a block diagram is illustrated of a sample measurement control system 500. The measurement control system 500 comprises robot control component 510, path plan component 520, collision detection component 530, analysis component 540, and user interface component 550. In accordance with one embodiment, the components of the measurement control system 500 can be computer-executable components that comprise instructions. When executed by a processor, the instructions perform the functionality of each component. A computing device is configured to be a special-purpose device or computer appliance that implements the measurement control system 500. In one instance, the computing device can be the rack computing device 430 of FIG. 4. Further, at least a subset of the functionality can be implemented on or provided to a computing device (e.g., laptop, tablet, desktop, control panel . . . ) of a system operator.

The robotic control component 510 is a mechanism for generating and communicating commands to a robotic arm regarding position and orientation. The robotic arm will need to be positioned at precise points to perform measurements. The robotic control component 510 can receive points and communicate commands or instructions supported by the robotic arm to drive the arm to the points. In one instance, the robotic control component 510 can map global points to local points given the robotic arm position. Further, the robotic control component 510 can seek to move efficiently between points by minimizing unnecessary movements.

The path plan component 520 is configured to identify points to perform measurements. A scan surface or geometry may be provided in one instance, including spherical, planar, cylindrical, and parametric (e.g., noncanonical). The path plan component 520 can identify a subset of points within the scan surface to perform measurements. The size of the scan surface and the points selected can be dictated by many factors, including, but not limited to, the location, size, and frequency of the antenna, the type of measurement (e.g., near field or far field), and objects in the surrounding space. The path plan component 520 selects points that define a virtual scan region around an antenna and test structure. This path plan or scan region can be communicated to the robotic control component 510 to execute. The robotic arm may not be able to reach all points in the path plan at a single location. Once the robotic arm is unable to locate any unmeasured reachable points, repositioning can occur. The robotic arm can continue the measurement of points from a new position. Essentially, the path plan can be segmented into pieces associated with pauses for repositioning.

The collision detection component 530 is configured to identify potential collisions and intervene to prevent collisions. In one instance, collaborative robotics can be employed that will stop after a collision providing a degree of safety. The collision detection component 530 attempts to prevent collisions in the first place. The robotic arm can operate with six degrees of freedom, which can result in potential collisions with itself, its assembly, or other structure such as the test structure. The collision detection component 530 can model an environment and simulate movements in the model environment to determine whether or not a collision may occur. In one embodiment, oriented bounding boxes (OBB) can be employed. Non-box shapes are wrapped with multiple boxes to provide a tight but oversized model. Collisions between collections of OBBs can be computed efficiently. In one embodiment, the collision detection component 530 is invoked by the robot control component 510 before each movement to avoid collisions. Additionally, the collision detection component 530 can evaluate a path plan before providing the plan to the robot control component 510 for execution.

The analysis component 540 is configured to evaluate received measurements and produce an output that describes the measurement results. In one instance, configuration suggestions can also be produced.

Figure 6:
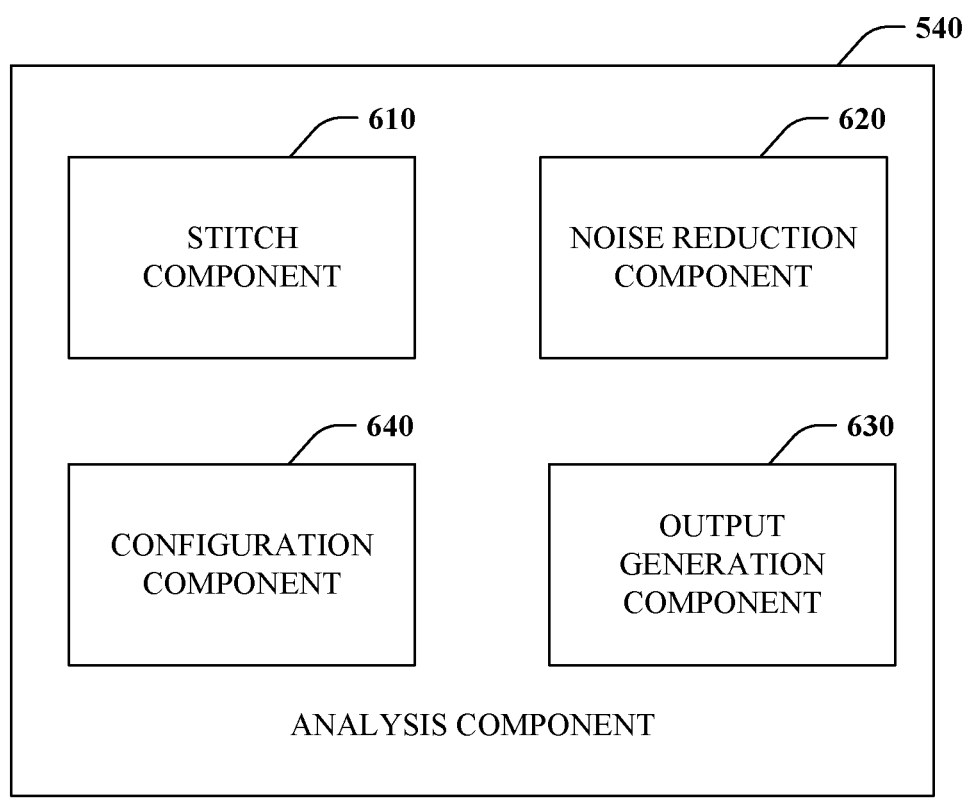
FIG. 6 is a block diagram of an analysis component.

Turning briefly to FIG. 6, an example analysis component 540 is depicted in further detail. The analysis component 540 includes stitch component 610, noise reduction component 620, output generation component 630, and configuration component 640. In one implementation, these components can be computer-executable components that comprise instructions that, when executed by a processor, cause the processor to perform the functionality of the analysis component 540.

The stitch component 610 is configured to stitch together, or otherwise combine, multiple data sets into a single data set. The robotic arm has a reach limited by its length. To reach some points, the robotic arm mobile base or lift can be repositioned horizontally or vertically. Measuring is paused when repositioning occurs. Subsequently, reachable points are measured. The result can be a segmented data set for each pause and reposition. The stitch component 610 can combine these data sets into a single data set representing the result of a single measurement session that included repositioning.

The noise reduction component 620 can seek to remove noise from a set of resulting emission measurements. Since regular measurement locations do not include anechoic foam on reflective services such as walls, doors, and floors, the antenna probe may receive some reflective emissions. Such reflective emissions can constitute noise for measurements. Time gating can be employed to remove this type of noise. With time gating, signals received after a predetermined time are discarded. It should be appreciated that a vector network analyzer can also perform such functionality. Regardless of where the noise reduction occurs, it substantially reduces reflections from distant objects. An operator can also place anechoic foam on objects close to where the measurement is performed to reduce noise further. In near-field measurement, foam can be placed on the floor and around landing gear on an aircraft, for example.

The output generation component 630 is configured to analyze the point measurements and produce a result. Measurements can correspond to emission values at particular points, including a position and orientation. In this instance, the output generation component 630 can generate an antenna pattern with this data. Near-field measurements can also be utilized to produce far-field measurements. Accordingly, the output generation component 630 can convert near-field measurements to far-field measurements before generating the antenna pattern. Of course, if the measurements are already far-field measurements, the conversion could be skipped.

The configuration component 640 can be configured to suggest configurations or changes to configurations to improve performance. The configuration component 640 can receive information about the antenna under test and the recorded measurements and determine or infer a change to a configuration that would likely improve performance.

Returning to FIG. 5, the user interface component 550 can generate a user interface that facilitates interaction with the measurement control system 500. For example, a graphical user interface can be generated and exposed to system operators to initiate, monitor, debug, and report results, among other things. In one instance, the user interface can be exposed wirelessly to an operator device as a network service. Alternatively, the interface can be presented on a display connected to the rack computer or the like. Regardless of the implementation, the user interface component 550 provides a mechanism for users, such as system operators, to interact with the measurement control system.

The disclosed system can be employed to track visible as well as hidden objects using coordinate system transforms. In some instances, an antenna can be covered by a radome or other protective equipment in its final configuration. Consequently, the antenna is not visible. To address this challenge, the antenna can be located on a vehicle, and a transformation matrix or the like can be computed by the measurement control system 500 based on a sensor or set of sensors visible on the vehicle body. This transformation matrix can be used to precisely track the antenna's position in six degrees of freedom even when the antenna is not visible to a laser tracker.

The aforementioned systems, architectures, platforms, environments, or the like have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component to provide aggregate functionality. Communication between systems, components and/or sub-components can be accomplished following either a push and/or pull control model. The components may also interact with one or more other components not specifically described herein for the sake of brevity but known by those of skill in the art.

Various portions of the disclosed systems above and methods below can include or employ artificial intelligence, machine learning, or knowledge or rule-based components, sub-components, processes, means, methodologies, or mechanisms (e.g., support vector machines, neural networks, expert systems, Bayesian belief networks, fuzzy logic, data fusion engines, classifiers, . . . ). Such components, among others, can automate certain mechanisms or processes performed thereby, making portions of the systems and methods more adaptive as well as efficient and intelligent. By way of example, and not limitation, the measurement control system 500 can employ such techniques to learn and infer efficient scan patterns. Further, noise can be inferred based on historical data regarding the same or similar measurements to aid in noise reduction. Furthermore, the configuration component 640 can employ these techniques to learn about the relationship between configuration and performance and employ that information to make suggestions or recommendations for changes to a configuration to improve performance in the future.

Figure 7:
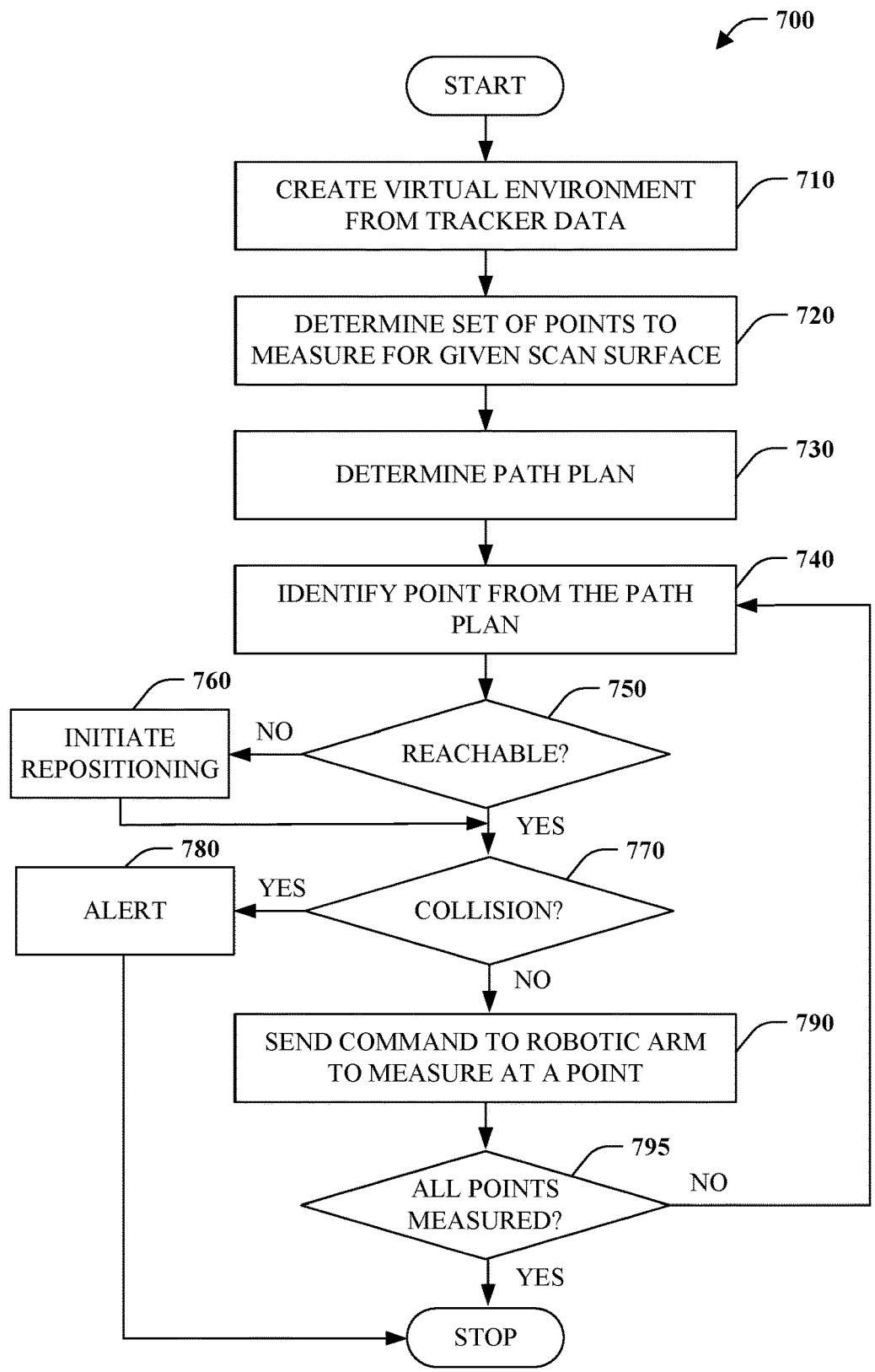
FIG. 7 is a flow chart diagram of a method of antenna measurement.
Figure 8:
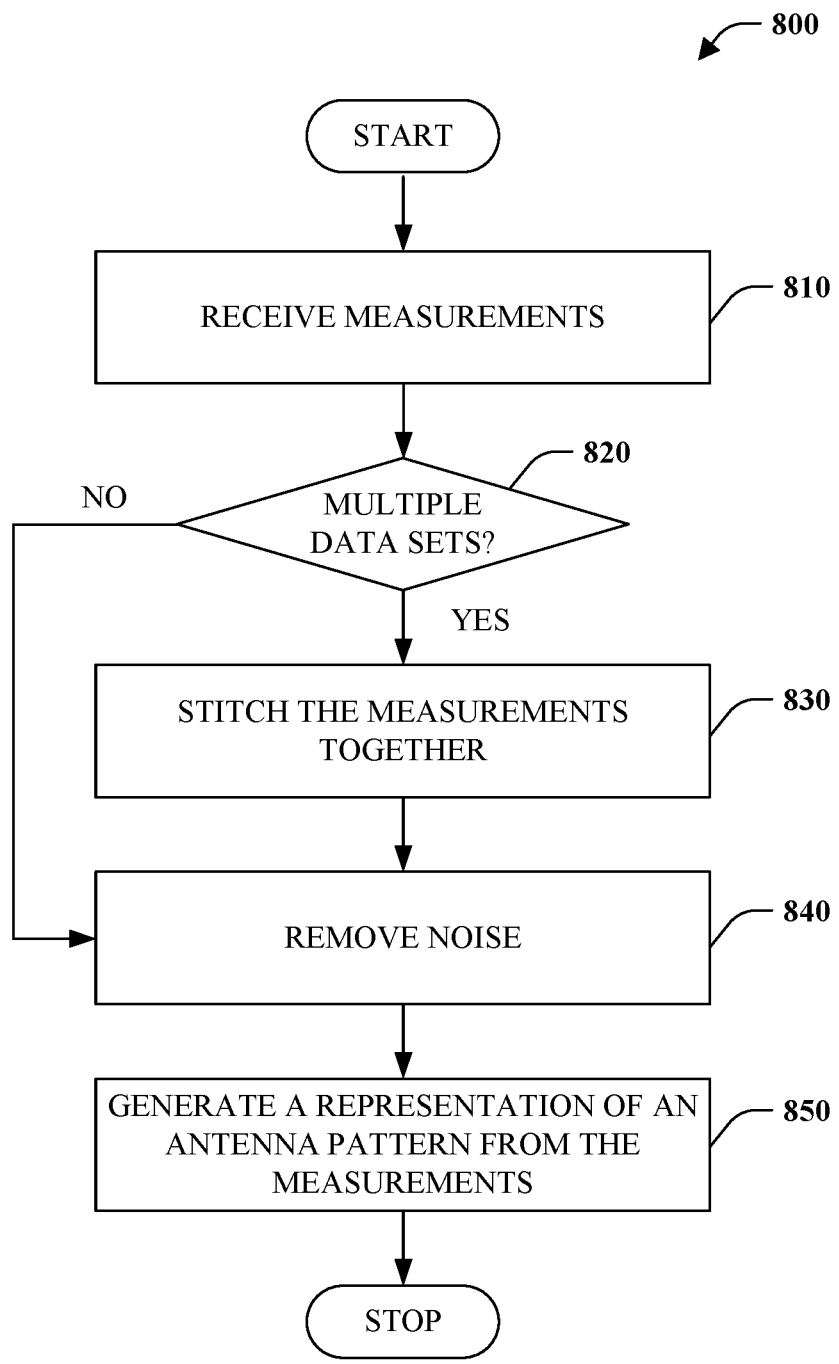
FIG. 8 is a flow chart diagram of a method of analyzing antenna measurements.
Figure 9:
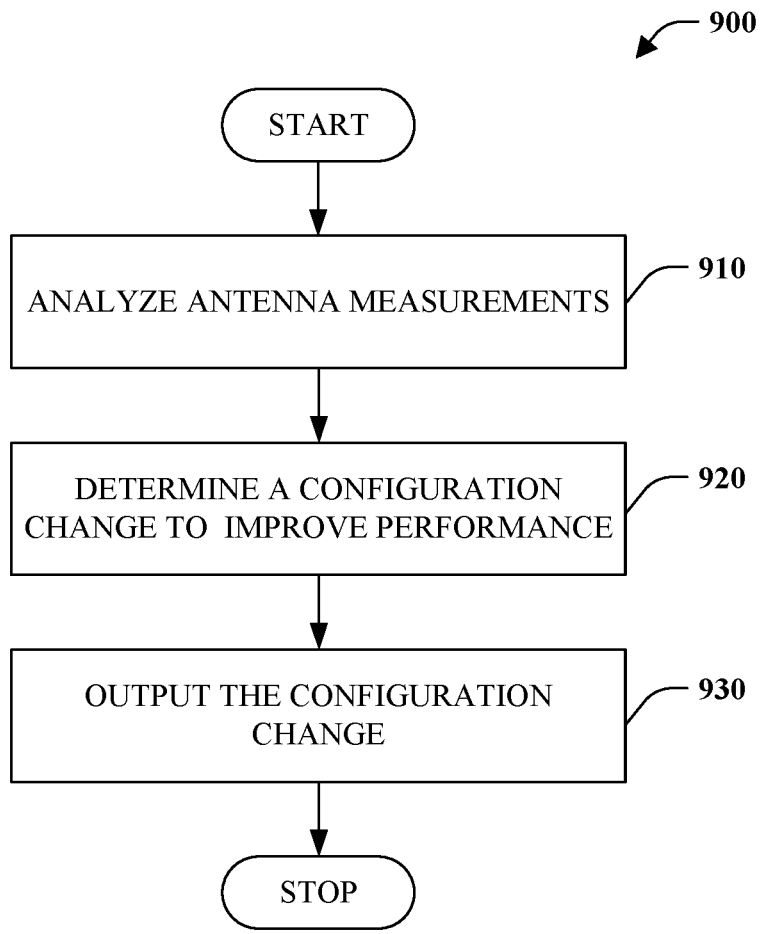
FIG. 9 is a flow chart diagram of a method of suggesting configuration.

In view of the example systems described above, methods that may be implemented in accordance with the disclosed subject matter will be better appreciated with reference to flow chart diagrams of FIGS. 7-9. While for purposes of simplicity of explanation, the methods are shown and described as a series of blocks, it is to be understood and appreciated that the disclosed subject matter is not limited by order of the blocks, as some blocks may occur in different orders and/or concurrently with other blocks from what is depicted and described herein. Moreover, not all illustrated blocks may be required to implement the methods described hereinafter. Further, each block or combination of blocks can be implemented by computer program instructions that can be provided to a processor to produce a machine, such that the instructions executing on the processor create a means for implementing functions specified by a flow chart block.

FIG. 4 illustrates a method 400 of antenna measurement. The method 400 can be performed by the measurement control system 500. In one instance, the method 400 can be executed by the rack computing device 430 alone or in combination with a computing device 140 of a system operator. Further, the method can interact with the adjustable probe assembly and the laser tracker assembly.

At reference numeral 710, a virtual environment is created from tracker data. A laser tracker can be employed to create a three-dimensional coordinate system, including locations of an antenna, a test structure, such as an aircraft, and a probe, among other things. This coordinate system is the virtual environment that can be utilized when making other determinations.

At 720, a set of points to measure is determined for a given scan surface. A scan surface can include canonical geometries such as spherical, cylindrical, and planar. However, the scan surface can also be noncanonical, or substantially any three-dimensional shape, termed parametric herein. The scan surface or shape can center around an antenna and test structure, on which the antenna is mounted, based on information regarding objects in a space as captured in the virtual environment. The size of the scan surface and the selected points can be based on a variety of factors, including, but not limited to, the location, size, and frequency of the antenna, the type of measurement being performed (e.g., near field, far field), and the position of the test structure within the environment.

At numeral 730, a path plan is determined. The path plan sets an order in which the points will be visited and measured. The path plan can seek to minimize repositioning by grouping points. Further, the path plan can seek to be efficient in movement and avoid potential collisions. In one instance, the path plan can specify a zigzag pattern of movement. The first point in the plan can be identified at 740. Herein, the point can specify a location and orientation.

At 750, a determination is made as to whether the point is reachable or not from the current location of the probe. In other words, the determination concerns whether the robotic arm alone can move the probe to the first point. If the point is not reachable ("NO"), the method 700 continues at 760, in which repositioning is initiated. Repositioning can be initiated by alerting an operator that repositioning is required. Further, information can be provided as to the nature of repositioning. For example, repositioning could be to move the robotic arm up or down to reach points. Alternatively, the repositioning can correspond to a horizontal movement. In this case, the system operator could perform the repositioning manually. Alternatively, the robotic arm could be mounted on a self-driving mobile base. In this instance, initiating the repositioning can invoke the self-driving functionality to move to a desired location automatically. If the point is reachable ("YES"), the method continues at 770. Similarly, after repositioning is performed at 760, the method 700 can proceed to 770.

At reference numeral 770, a determination is made as to whether or not a movement to the point would result in a collision. In one implementation, a model of the environment can be created, and simulated movements within the model environment can be utilized to determine whether a collision may occur. For example, oriented bounding boxes can be employed, and non-box shapes can be wrapped with multiple boxes to provide a tight but oversized model. A determination can be made as to whether there is a collision between collections of boxes. If it is determined that a collision will happen ("YES"), an alert is triggered at 780, and the method terminates. If it is determined that there will not be a collision ("NO"), the method continues at 790.

At 790, a command is sent to the robotic arm to measure a point. In response, the robotic arm will move to the point, and a measurement will be taken with an antenna probe. For example, antenna emission can be captured at the point. A vector network analyzer can be involved in acquiring and capturing the measure for future processing. The method can next proceed to 795.

At reference numeral 795, a determination is made as to whether or not all points have been measured. In other words, the determination concerns whether the path plan was executed to completion, such that all the points were visited and measured. If it is determined that all points have not been measured ("NO"), the method returns to numeral 740, where the next point in the path plan is identified. If it is determined that all points have been measured ("YES"), the method terminates successfully.

FIG. 8 is a flow chart diagram of a method 800 of analyzing antenna measurements. The method 800 can be executed by the measurement control system 500 and, more particularly, the analysis component 540. Further, the method 800 can be executed by the rack computing device alone or in combination with another computing device associated with a system operator.

At reference numeral 810, measurements are received. The measurements can correspond to emission measurements at particular positions and orientations. In one instance, the measurements can be received from a vector network analyzer or associated data store.

At numeral 820, a determination is made regarding whether or not multiple data sets are associated with a single measurement process. In accordance with one aspect, multiple data sets can be produced when repositioning occurs. If a robotic arm and attached probe can reach all points from an initial position, a single data set will be produced with all measurements for the process. For larger structures, repositioning of the robotic arm may be needed. In this case, the measurement process can be paused during repositioning and then resumed. When the measurement process is resumed, a new data set can be generated associated with the new position. If it is determined that there are not multiple data sets ("NO"), the method 800 proceeds to numeral 840. If it is determined that there are multiple data sets ("YES"), the method continues at 830.

At reference 830, measurements from multiple data sets are stitched together. Stated differently, the measurements from each distinct data set are combined into a single data set associated with a measurement process. The method can then proceed at 840.

At numeral 840, the measurements are analyzed for noise, and if detected, the noise is removed. In one scenario, the measurements can include emissions reflected by one or more surfaces. Reflected emissions can be deemed noise. One way to remove this type of noise is through time gating. A predetermined time can be selected after which received emissions are considered noise and removed. Time gating can effectively remove emissions reflected from distant surfaces such as walls or doors as they will take more time to be received.

At reference numeral 850, a representation of an antenna pattern can be generated from the measurements and positions. For instance, a magnitude of a measurement can be plotted for a particular location where the measurement was received. The representation can subsequently be conveyed for display on a display device. For example, the representation can be presented on a display of a computing device of a system operator.

FIG. 9 is a flow chart diagram of a method 900 of suggesting an antenna configuration. The method 900 can be performed by the measurement control system 500 and, more particularly, the analysis component 540. The method 900 can be executed by the rack computing device alone or in combination with another computing device associated with a system operator.

At reference 910, antenna measurements are analyzed. The measurements can quantify emissions at a particular point in space. These measurements can be compared with expected or high-performing measurements for the particular antenna. At numeral 920, a determination is made as to a configuration or configuration change that may improve the performance of the antenna compared to expected or high-performing antennas of the same type. At reference numeral 930, the configuration or configuration change is output as a suggestion or recommendation.

The subject measurement system and method can track both visible and hidden objects using coordinate system transforms. For example, an installed antenna under test is often covered by a radome in its final configuration and is not visible during testing. The system can locate the antenna on the vehicle and calculate a transformation matrix to a sensor or set of sensors visible on the vehicle body during measurement. The system can then use this transformation matrix to precisely track the antenna's position in six degrees of freedom even when the antenna is not visible to a laser tracker.

The subject disclosure pertains to the technical problem of antenna performance measurement when mounted on structures such as an aircraft. The technical solution is a portable antenna measurement system that allows in situ measurement, such as in an aircraft hangar. The equipment can be packed on a set of pallets and shipped to a location without requiring special equipment such as a crane. Once deployed, the system can be configured to scan over arbitrary surface geometries (e.g., spherical, cylindrical, planer, or parametric), accommodate different scan sizes, and be used for near-field and far-field data collection. Further, the system can accurately test configurations where an installed antenna is not visible or covered by a radome or the like.

Conventional measurements of an antenna mounted on a test structure are provided in a highly specialized and rare facility that corresponds to a large-scale antenna range. The facility and the measurement systems are fixed. Other systems have been explored, including extremely heavy systems that require specialized equipment for movement, such as a modified crane. Although these systems may be described as portable, their size, weight, and dependency on specialized equipment place limits on portability. Transportable is a more accurate term for such systems. The disclosed system was designed to be much more portable. The system was designed using lightweight materials and for the system to be transported easily by a person or two. In one instance, portions can be disassembled and reassembled on site. Further, the system is not fixed to the floor during operation but rather is movable by a system operator or self-drivable. The subject system is thus termed portable to distinguish from fixed and transportable solutions.

Aspects of the disclosure have been primarily described regarding testing and measuring an aircraft antenna for simplicity and clarity. However, disclosed aspects are not limited to aircraft or antennas. The portability and accuracy disclosed apply to substantially any object of any size. Further, the probe can be changed or reconfigured to measure other properties beyond radiation associated with an antenna, such as heat and sound, among other things. By way of example, and not limitation, disclosed aspects are applicable to the automobile industry for in situ testing of vehicle radar and communication systems.

As used herein, the terms "component" and "system," as well as various forms thereof (e.g., components, systems, sub-systems . . . ) are intended to refer to a computer-related entity, either hardware, a combination of hardware and software, software, or software in execution. For example, a component may be but is not limited to being a process running on a processor, a processor, an object, an instance, an executable, a thread of execution, a program, and/or a computer. By way of illustration, both an application running on a computer and the computer can be a component. One or more components may reside within a process and/or thread of execution, and a component may be localized on one computer and/or distributed between two or more computers.

As used herein, the term "infer" or "inference" generally refer to the process of reasoning about or inferring states of a system, a component, an environment, or a user from one or more observations captured by way of events or data, among other things. Inference may be employed to identify a context or an action or may be used to generate a probability distribution over states, for example. An inference may be probabilistic. For example, computation of a probability distribution over states of interest can be based on a consideration of data or events. Inference may also refer to techniques employed for composing higher-level events from a set of events or data. Such inference may result in the construction of new events or new actions from a set of observed events or stored event data, whether or not the events are correlated in close temporal proximity, and whether the events and data come from one or several events and data sources.

The conjunction "or" as used in this description and appended claims is intended to mean an inclusive "or" rather than an exclusive "or," unless otherwise specified or clear from the context. In other words, "'X' or 'Y'" is intended to mean any inclusive permutations of "X" and "Y." For example, if "'A' employs 'X,'" "'A employs 'Y,' " or "'A' employs both 'X' and 'Y,'" then "'A' employs 'X' or 'Y'" is satisfied under any of the preceding instances.

Furthermore, to the extent that the terms "includes," "contains," "has," "having" or variations in form thereof are used in either the detailed description or the claims, such terms are intended to be inclusive in a manner similar to the term "comprising" as "comprising" is interpreted when employed as a transitional word in a claim.

Figure 10:
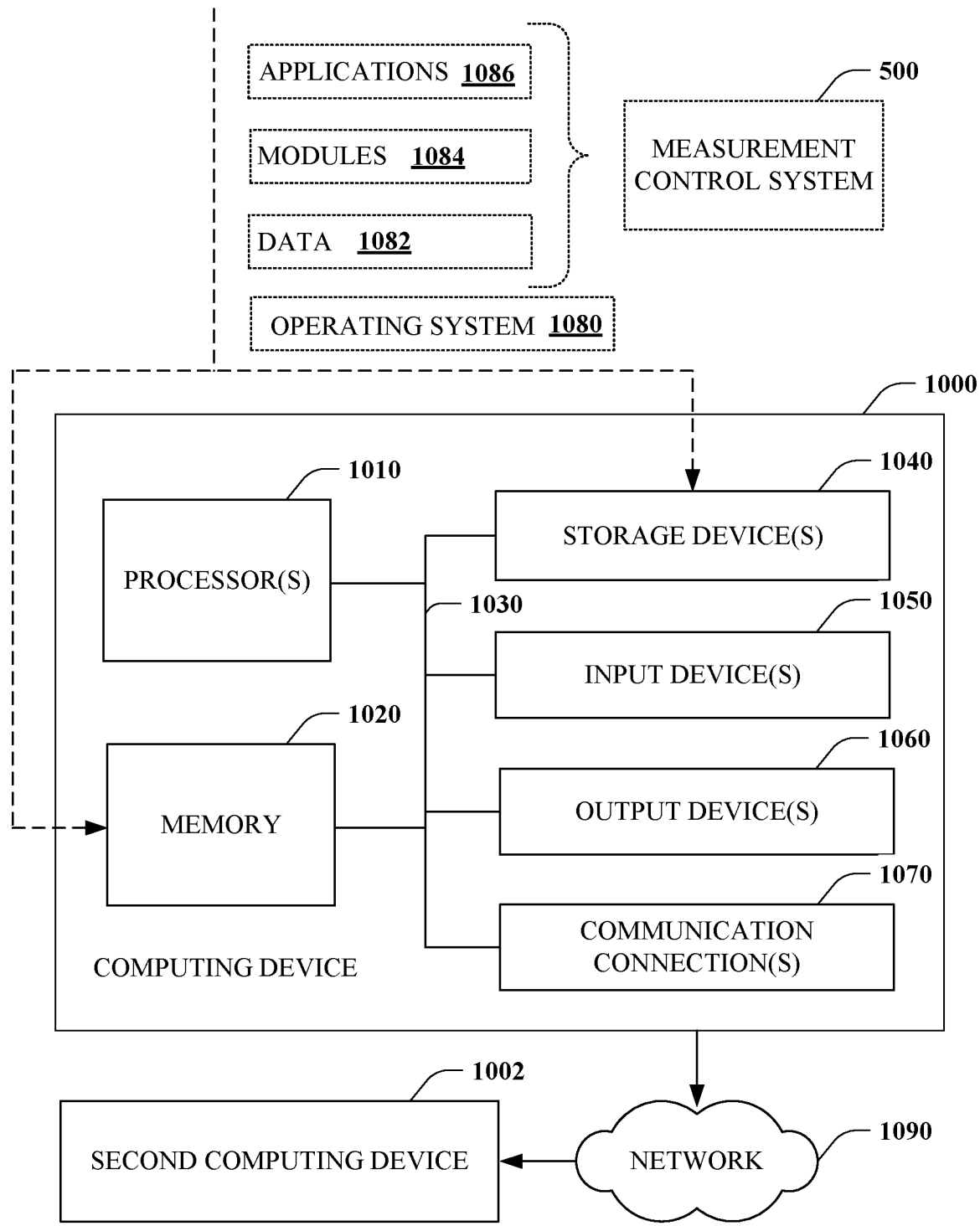
FIG. 10 is a block diagram illustrating a suitable operating environment for aspects of the subject disclosure.

To provide a context for the disclosed subject matter, FIG. 10 and the following discussion are intended to provide a brief, general description of a suitable environment in which various aspects of the disclosed subject matter can be implemented. However, the suitable environment is solely an example and is not intended to suggest any limitation regarding scope of use or functionality.

While the above-disclosed system and methods can be described in the general context of computer-executable instructions of a program that runs on one or more computers, those skilled in the art will recognize that aspects can also be implemented in combination with other program modules or the like. Generally, program modules include routines, programs, components, data structures, among other things, that perform particular tasks and/or implement particular abstract data types. Moreover, those skilled in the art will appreciate that the above systems and methods can be practiced with various computer system configurations, including single-processor, multi-processor or multi-core processor computer systems, mini-computing devices, server computers, as well as personal computers, hand-held computing devices (e.g., personal digital assistant (PDA), smartphone, tablet, watch . . . ), microprocessor-based or programmable consumer or industrial electronics, and the like. Aspects can also be practiced in distributed computing environments where tasks are performed by remote processing devices linked through a communications network. However, some, if not all aspects, of the disclosed subject matter can be practiced on stand-alone computers. In a distributed computing environment, program modules may be located in one or both of local and remote memory devices.

With reference to FIG. 10, illustrated is an example computing device 1000 (e.g., desktop, laptop, tablet, watch, server, hand-held, programmable consumer or industrial electronics, set-top box, game system, compute node . . . ). The computing device 1000 includes one or more processor(s) 1010, memory 1020, system bus 1030, storage device(s) 1040, input device(s) 1050, output device(s) 1060, and communications connection(s) 1070. The system bus 1030 communicatively couples at least the above system constituents. However, the computing device 1000, in its simplest form, can include one or more processors 1010 coupled to memory 1020, wherein the one or more processors 1010 execute various computer-executable actions, instructions, and or components stored in the memory 1020.

The processor(s) 1010 can be implemented with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. The processor(s) 1010 may also be implemented as a combination of computing devices, for example, a combination of a DSP and a microprocessor, a plurality of microprocessors, multi-core processors, one or more microprocessors in conjunction with a DSP core, or any other such configuration. In one embodiment, the processor(s) 1010 can be a graphics processor unit (GPU) that performs calculations concerning digital image processing and computer graphics.

The computing device 1000 can include or otherwise interact with a variety of computer-readable media to facilitate control of the computing device to implement one or more aspects of the disclosed subject matter. The computer-readable media can be any available media accessible to the computing device 1000 and includes volatile and non-volatile media, and removable and non-removable media. Computer-readable media can comprise two distinct and mutually exclusive types: storage media and communication media.

Storage media includes volatile and non-volatile, removable and non-removable media implemented in any method or technology for storage of information such as computer-readable instructions, data structures, program modules, or other data. Storage media includes storage devices such as memory devices (e.g., random access memory (RAM), read-only memory (ROM), electrically erasable programmable read-only memory (EEPROM) . . . ), magnetic storage devices (e.g., hard disk, floppy disk, cassettes, tape . . . ), optical disks (e.g., compact disk (CD), digital versatile disk (DVD) . . . ), and solid-state devices (e.g., solid-state drive (SSD), flash memory drive (e.g., card, stick, key drive . . . ) . . . ), or any other like mediums that store, as opposed to transmit or communicate, the desired information accessible by the computing device 1000. Accordingly, storage media excludes modulated data signals as well as that which is described with respect to communication media.

Communication media embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared, and other wireless media.

The memory 1020 and storage device(s) 1040 are examples of computer-readable storage media. Depending on the configuration and type of computing device, the memory 1020 may be volatile (e.g., random access memory (RAM)), non-volatile (e.g., read only memory (ROM), flash memory . . . ), or some combination of the two. By way of example, the basic input/output system (BIOS), including basic routines to transfer information between elements within the computing device 1000, such as during start-up, can be stored in non-volatile memory, while volatile memory can act as external cache memory to facilitate processing by the processor(s) 1010, among other things.

The storage device(s) 1040 include removable/non-removable, volatile/non-volatile storage media for storage of vast amounts of data relative to the memory 1020. For example, storage device(s) 1040 include, but are not limited to, one or more devices such as a magnetic or optical disk drive, floppy disk drive, flash memory, solid-state drive, or memory stick.

Memory 1020 and storage device(s) 1040 can include, or have stored therein, operating system 1080, one or more applications 1086, one or more program modules 1084, and data 1082. The operating system 1080 acts to control and allocate resources of the computing device 1000. Applications 1086 include one or both of system and application software and can exploit management of resources by the operating system 1080 through program modules 1084 and data 1082 stored in the memory 1020 and/or storage device(s) 1040 to perform one or more actions. Accordingly, applications 1086 can turn a general-purpose computer 1000 into a specialized machine in accordance with the logic provided thereby.

All or portions of the disclosed subject matter can be implemented using standard programming and/or engineering techniques to produce software, firmware, hardware, or any combination thereof to control the computing device 1000 to realize the disclosed functionality. By way of example and not limitation, all or portions of the measurement control system 500 can be, or form part of, the application 1086, and include one or more modules 1084 and data 1082 stored in memory and/or storage device(s) 1040 whose functionality can be realized when executed by one or more processor(s) 1010.

In accordance with one particular embodiment, the processor(s) 1010 can correspond to a system on a chip (SOC) or like architecture including, or in other words integrating, both hardware and software on a single integrated circuit substrate. Here, the processor(s) 1010 can include one or more processors as well as memory at least similar to the processor(s) 1010 and memory 1020, among other things. Conventional processors include a minimal amount of hardware and software and rely extensively on external hardware and software. By contrast, a SOC implementation of a processor is more powerful, as it embeds hardware and software therein that enable particular functionality with minimal or no reliance on external hardware and software. For example, the measurement control system 500 and/or functionality associated therewith can be embedded within hardware in a SOC architecture.

The input device(s) 1050 and output device(s) 1060 can be communicatively coupled to the computing device 1000. By way of example, the input device(s) 1050 can include a pointing device (e.g., mouse, trackball, stylus, pen, touchpad . . . ), keyboard, joystick, microphone, voice user interface system, camera, motion sensor, and a global positioning satellite (GPS) receiver and transmitter, among other things. The output device(s) 1060, by way of example, can correspond to a display device (e.g., liquid crystal display (LCD), light emitting diode (LED), plasma, organic light-emitting diode display (OLED) . . . ), speakers, voice user interface system, printer, and vibration motor, among other things. The input device(s) 1050 and output device(s) 1060 can be connected to the computing device 1000 by way of wired connection (e.g., bus), wireless connection (e.g., Wi-Fi, Bluetooth . . . ), or a combination thereof.

The computing device 1000 can also include communication connection(s) 1070 to enable communication with at least a second computing device 1002 utilizing a network 1090. The communication connection(s) 1070 can include wired or wireless communication mechanisms to support network communication. The network 1090 can correspond to a local area network (LAN) or a wide area network (WAN) such as the Internet. The second computing device 1002 can be another processor-based device with which the computing device 1000 can interact. In one instance, the computing device 1000 can correspond to the rack computing device. The second computing device 1002 can correspond to an additional computing device of a system operator such as a laptop. The computing device 1000 can then communicate with the second computing device and vice versa over the network 1090. For example, input from an operator computing device can be provided to the rack computing device to set up a measurement process. Likewise, the rack computing device can communicate with the operator computing device regarding results, alerts, and errors, among other things.

What has been described above includes examples of aspects of the claimed subject matter. It is, of course, not possible to describe every conceivable combination of components or methodologies for purposes of describing the claimed subject matter. However, one of ordinary skill in the art may recognize that many further combinations and permutations of the disclosed subject matter are possible. Accordingly, the disclosed subject matter is intended to embrace all such alterations, modifications, and variations that fall within the spirit and scope of the appended claims.

What is claimed is:

1. A portable antenna measurement system, comprising:
a mobile base;
a lift portion attached perpendicular to the mobile base and extending vertically;
a collaborative robotic arm connected at a first end to the lift portion;
an antenna probe affixed to a second end of the collaborative robotic arm, wherein the antenna probe is configured to measure antenna performance at particular locations reachable by the robotic arm;
a measurement control system in communication with the mobile base, lift portion, and the robotic arm;
a path plan component in the measurement control system; wherein the path plan identifies points to perform measurements and includes pauses for repositioning the robotic arm using the mobile base when the robotic arm is unable to locate any unmeasured reachable points;

a robotic control component in the measurement control system for generating and communicating commands based on the path plan to the mobile base, lift portion, and the robotic arm regarding position and orientation to drive the antenna probe affixed to the second end of the robotic arm.

2. The system of claim 1, wherein height of the lift portion is adjustable vertically to increase reach of the robotic arm and the antenna probe.

3. The system of claim 1, wherein position of the antenna probe is adjustable with six degrees of freedom.

4. The system of claim 3, wherein the antenna probe can measure spherical, cylindrical, planar, and parametric scan surfaces.

5. The system of claim 1, further comprising a laser tracker that generates a set of coordinates associated with an environment surrounding an antenna, wherein the set of coordinates corresponds to a virtual representation of the environment.

6. The system of claim 5, wherein the environment surrounding the antenna comprises an aircraft to which the antenna is mounted.

7. The system of claim 6, wherein the environment surrounding the antenna includes the mobile base, lift portion, collaborative robotic arm, and antenna probe.

8. The system of claim 5, wherein the laser tracker is mounted on a second mobile base.

9. The system of claim 5, further comprising a vector network analyzer, communicatively coupled to the antenna probe, comprises a source to generate a signal and a receiver to receive a signal from an antenna.

10. The system of claim 9, further comprising a computing device comprising a processor coupled to a memory that includes instructions that, when executed by the processor, cause the processor to construct a path of points from which to collect measurements with the antenna probe.

11. The system of claim 10, wherein the instructions further cause the processor to generate an antenna pattern from point measurements.

* * * * *